United States Patent
Tolhuizen et al.

(10) Patent No.: US 7,047,477 B2
(45) Date of Patent: May 16, 2006

(54) ENHANCED CODING FOR INFORMED DECODERS

(75) Inventors: Ludovicus Marinus Gerardus Maria Tolhuizen, Eindhoven (NL); Martinus Wilhelmus Blum, Eindhoven (NL); Constant Paul Marie Jozef Baggen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 608 days.

(21) Appl. No.: 10/219,418

(22) Filed: Aug. 15, 2002

(65) Prior Publication Data

US 2003/0095056 A1 May 22, 2003

(30) Foreign Application Priority Data

Aug. 20, 2001 (EP) ............................................ 01203147

(51) Int. Cl.
*G11B 20/18* (2006.01)

(52) U.S. Cl. ......................................... 714/768; 369/47

(58) Field of Classification Search ................. 714/768; 369/47
See application file for complete search history.

(56) References Cited

U.S. PATENT DOCUMENTS

| | | | | | |
|---|---|---|---|---|---|
| 4,847,705 | A | * | 7/1989 | Weng et al. ................... | 360/49 |
| 4,910,736 | A | * | 3/1990 | Tanaka et al. ............... | 714/758 |
| 4,949,200 | A | * | 8/1990 | Weng .......................... | 360/72.2 |
| 4,955,022 | A | * | 9/1990 | Odaka ......................... | 714/755 |
| 5,216,656 | A | * | 6/1993 | Sako et al. ............. | 369/59.25 |
| 5,379,305 | A | * | 1/1995 | Weng .......................... | 714/774 |

(Continued)

FOREIGN PATENT DOCUMENTS

EP     1 201 841 A1     2/2002

OTHER PUBLICATIONS

M. van Dijk, "Coding fro Informed Decoders", Proceedings of the 2001 IEEE International Symposium on Information Theory, ISIT 2001, Washington, Jun., 2001, IEEE International Symposium on Information Theroy, NY Jun. 2001, pp. 202–202, XP010552812.

Richard E. Blahut, "Theory and Practice of Error–Control Codes", Addison–Wesley Publishing Company, May 1984, Sec. 3.2.

* cited by examiner

*Primary Examiner*—Stephen M. Baker
(74) *Attorney, Agent, or Firm*—Michael E. Belk

(57) ABSTRACT

The invention relates to method of encoding address words (a) comprising address symbols ($a_0$, $a_1$, . . . $a_{k-1}$) into codewords (c) of a code (C) for providing an enhanced error correction capability if at least one information symbol ($m_1$) of information words (m) is known a priori to a decoder decoding received, possibly mutilated codewords (r). The invention relates further to a method of decoding possibly mutilated codewords (r). In order to design a code of which the correction power is enhanced if some information symbols are known to the decoder prior to decoding it is proposed according to the invention that the address words (a) are encoded into information words (m) such that that address words comprising addresses being close to each other share a plurality of information symbols and that said information words (m) are encoded into codewords (c) using a generator matrix (G) which is selected such that the minimum Hamming distance of at least one subcode (C') of said code (C) is larger than the minimum Hamming distance of said code (C) and that a subcode generator matrix (G') of said subcode (C') derives from said generator matrix (G) of said code (C) by omitting the at least one row from said generator matrix (G) corresponding to said at least one a priori known information symbol ($m_1$).

16 Claims, 6 Drawing Sheets

U.S. PATENT DOCUMENTS

| | | | | |
|---|---|---|---|---|
| 5,434,719 A | * | 7/1995 | Miller et al. | 360/53 |
| 5,539,755 A | * | 7/1996 | Baggen | 714/779 |
| 5,805,368 A | | 9/1998 | Hishikawa | 360/51 |
| 5,815,332 A | * | 9/1998 | Suzuki et al. | 360/48 |
| 5,828,513 A | * | 10/1998 | Greenberg | 360/77.08 |
| 6,005,727 A | * | 12/1999 | Behrens et al. | 360/48 |
| 6,226,138 B1 | * | 5/2001 | Blaum et al. | 360/48 |
| 6,731,444 B1 | * | 5/2004 | Teng et al. | 360/48 |

ENHANCED CODING FOR INFORMED DECODERS

The invention relates to a method of encoding address words comprising address symbols into codewords of a code for providing an enhanced error correction capability if at least one information symbol of information words is known a priori to a decoder decoding received, possibly mutilated codewords. The invention relates further to a method of decoding possibly mutilated codewords of a code into address words. Still further, the invention relates to a corresponding apparatus for encoding information words, to a corresponding apparatus for decoding possibly mutilated codewords, to a computer program implementing said methods, to a data carrier for recording user data and to a signal for transmitting user data.

In European patent application EP 01 201 841.2 (PHNL 10331), the content of which is herein incorporated by reference, a method is described that allows to enhance the error correcting capabilities of an error correcting code if some of the information symbols are known to the decoder. A possible application is in the field of address retrieval on optical media. The sector address on optical media is part of a header which is protected by an error correcting code. Under many circumstances, much of the header information of the current sector can be inferred from the previously read sectors and the table of contents, or from the knowledge where the reading or writing head will approximately land.

The method described in European patent application EP 01 201 841.2 (PHNL 10331) suffers from the following problem. Assuming that the addresses of consecutive sectors are the binary representation of consecutive integers. Considering, as a simple example, 8 bit addresses, the sector with address 01111111 is followed by the sector with address 10000000. If the reading or writing head should land on the sector with address 01111111, then, even if the inaccuracy of landing would be limited to one single sector, no single bit of the address is known to the decoder and the method described in European patent application EP 01 201 841.2 (PHNL 10331) can not be applied.

It is therefore an object of the present invention to design a code the error correction power of which is enhanced if some information symbols are known to the decoder prior to decoding. It is a further object to benefit from approximate knowledge of the landing place of the reading or writing head even on places where many, or even all, bits of consecutive sector addresses change. Still a further object of the present invention is, to provide a method of encoding address words into codewords and a method of decoding a possibly mutilated codeword encoded by such a method of encoding. Further, corresponding apparatuses shall be provided.

These objects are achieved by a method of encoding of claim 1, according to which the address words are encoded into information words such that address words comprising addresses being close to each other share a plurality of information symbols and said information words are then encoded into codewords using a generator matrix selected such that the minimum Hamming distance of at least one subcode of said code is larger than the minimum Hamming distance of said code and that a subcode generator matrix of said subcode derives from said generator matrix of said code by omitting the at least one row from said generator matrix corresponding to said at least one a priori known information symbol. These objects are further achieved by a method of decoding as claimed in claim 8.

According to the present invention the address words are pre-processed and mapped onto information words. Thus, the above described situation where more than one of the most significant symbols changes if an address is incremented does not appear in the information words onto which the address words are mapped according to such pre-processing.

Further, according to the present invention the mapping of said information words onto codewords is such that the decoder can enhance the effective Hamming distance if some information symbols of the information words are known. However, it is assumed that the encoder is not informed about which, if any, symbols are actually known to the decoder. To get such an enhancement of the effective Hamming distance a certain predefined (i.e. previously selected) generator matrix is used. Said predefined generator matrix is then used for encoding and decoding, i.e. it needs to be used as a standard generator matrix. In other words, the generator matrix is selected such that the minimum Hamming distance of a subcode is larger than the minimum Hamming distance of the complete code.

The concept of using a generator matrix for encoding information words into codewords is widely used and known, e.g. from Richard E. Blahut "Theory and Practice of Error-Control Codes", Addison Wesley, May 1984, Sec. 3.2. Such a generator matrix is particularly used and described in standards, like the CD audio standard.

When using said predefined generator matrix, address information can be protected more reliably. If part of the address information, e.g. the most significant bits, is already known to the decoder if a new command to access a certain address on a data carrier, e.g. a disk, is given, address retrieval is more reliable which is especially important during writing. The decoder can then effectively use a subcode having an increased minimum Hamming distance. However, if no information symbols are known to the decoder a priori, decoding of the retrieved codeword is possible as usual and the Hamming distance of the code used according to the invention will be the same as the Hamming distance of known codes, i.e. no subcode with a larger minimum Hamming distance can be used during decoding.

When receiving a possibly mutilated codeword, e.g. by reading it from a data carrier, and in the case where at least one information symbol is known to the decoder a priori, e.g. the most significant bits of a read address, the decoder first decodes the possibly mutilated codeword into an intermediate codeword using a standard Reed-Solomon (RS) decoder. Said intermediate codeword is then post-processed, i.e. decoded into an information word.

In a preferred embodiment said post-processing includes a syndrome calculation. To obtain the information symbols the intermediate codeword is thus evaluated in the zeros corresponding to the information symbols. Finally, the address word is obtained from said information word by a method corresponding to the method which had been used for encoding the address words into information words.

Because of said address pre-processing during encoding, only one of the information symbols will change if an address is incremented, e.g. only one of the information symbols will change at a time when jumping from the inside to the outside of a disk. Therefore, if the jump accuracy is such that that the address of the actual landing place differs at most k from the address of the target landing place, at least k−1 information symbols will be known for every jump on a disk.

When selecting the generator matrix as described above, the error correction power can be enhanced if some information symbols are known to the decoder prior to decoding. There may be different levels of improvement depending on which and how many information symbols are known to the decoder.

Preferred embodiments of the invention are defined in the dependent claims. In an aspect of the invention the address words are encoded into information words by applying a Gray Code. Thus only one information symbol changes if an address word is incremented, i.e. information words corresponding to consecutive address words differ in one information symbol. A q-ary Gray code of dimension m is a sequence of $q^l$ distinct q-ary length m strings such that any two adjacent words have a Hamming distance of one.

According to the invention, encoding address words to information words is preferably done by inverting address symbols of an address word if the least significant bit of the respective previous address symbol has bit value one. This is done for a number of address words. In a particular embodiment thereof the address symbols of an address word are inverted by calculating the exclusive OR result between all bits of an address symbol and the least significant bit of the respective previous address symbol, i.e. all bits of an address symbol are separately input to an XOR gate to which as a second input the least significant bit of the previous address symbol is fed. However, it has to be noted that some of the address symbols may also appear unaltered as information symbols, said unaltered symbols being used as auxiliary symbols.

Preferred embodiments of the step of encoding the information words into codewords are defined in claims 5 and 7. A method of decoding possibly mutilated codewords and particular embodiments thereof are defined in claims 8 to 10.

An advantageous application of the present invention lies in the field of address retrieval, in particular on optical media. When using the invention an address or timing information can be protected by a higher error correction capacity making an address retrieval more secure and accurate. The invention can further be used for securing address information in a serial data stream, which is, for example, transmitted over a transmission line like a telecommunication network or the internet. In general, the invention can be used for protecting information by a code having an improved—compared to known codes—error correction capacity if part of the information is known a priori to the decoder.

An apparatus for encoding information words and an apparatus for decoding a possibly mutilated codeword according to the invention are defined in claims 11 and 12. It shall be understood that these apparatuses can be developed further and can have similar embodiments which have been explained above with reference to the method of encoding according to claim 1.

A computer program according to the invention for implementing any or all methods according to the invention is defined in claim 13.

A data carrier according to the invention is defined in claims 14 and 15. Such a data carrier is preferably used for storing audio, video or software data and might be of a recordable or rewriteable type, in particular an optical record carrier like a CD or a DVD. A particular application of the invention lies in the field of optical recording, particularly as proposed in the standard for DVR (digital video recording), preferably in the field of encoding wobble addresses in DVR. Generally, such a data carrier comprises system data items, in particular system data items of address data, timing data or position data, which are already recorded on the data carrier at the production site of the data carrier and which are already present when an empty data carrier for recording user data is bought. The invention may thus be used for encoding said system data items. However, the invention may as well be used for encoding user data.

Still further, a signal for transmitting user data, said signal including system data items, e.g. position, address or timing data, encoded by a method according to the inventions is defined in claim 16.

The invention will now be further explained in more detail with reference to the drawings, in which.

Figure 3:
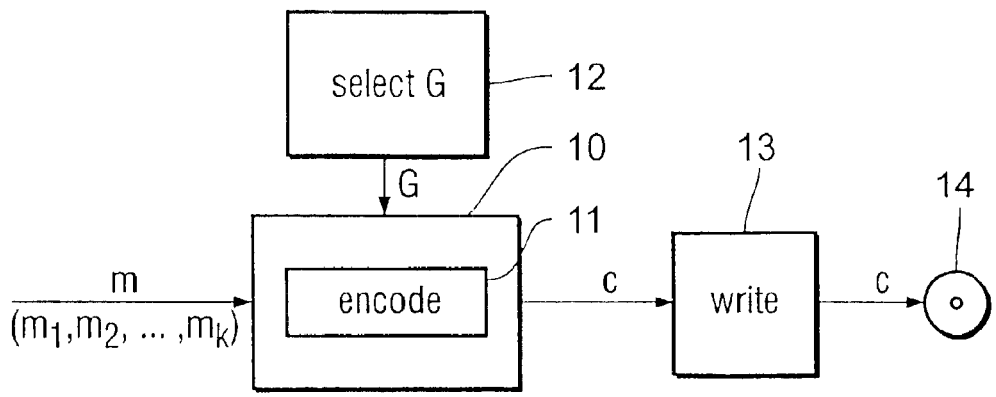
Figure 4:
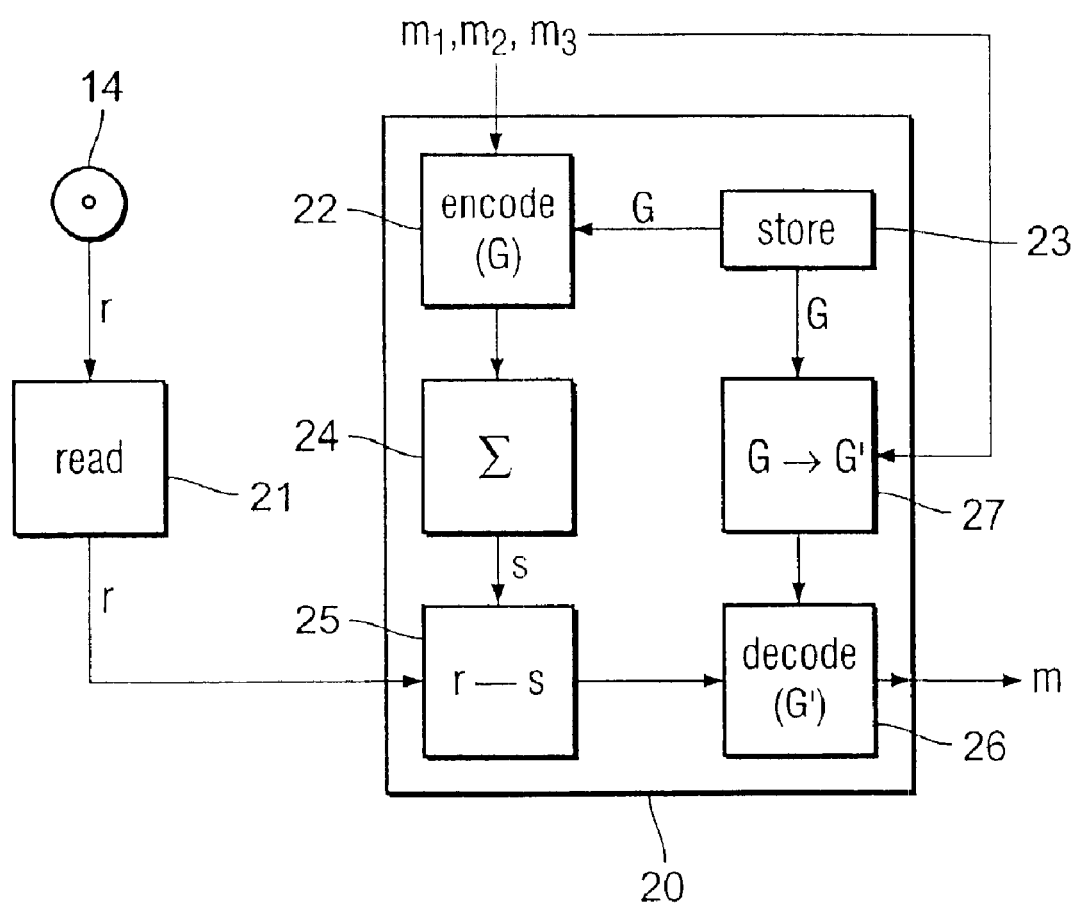
Figure 5:
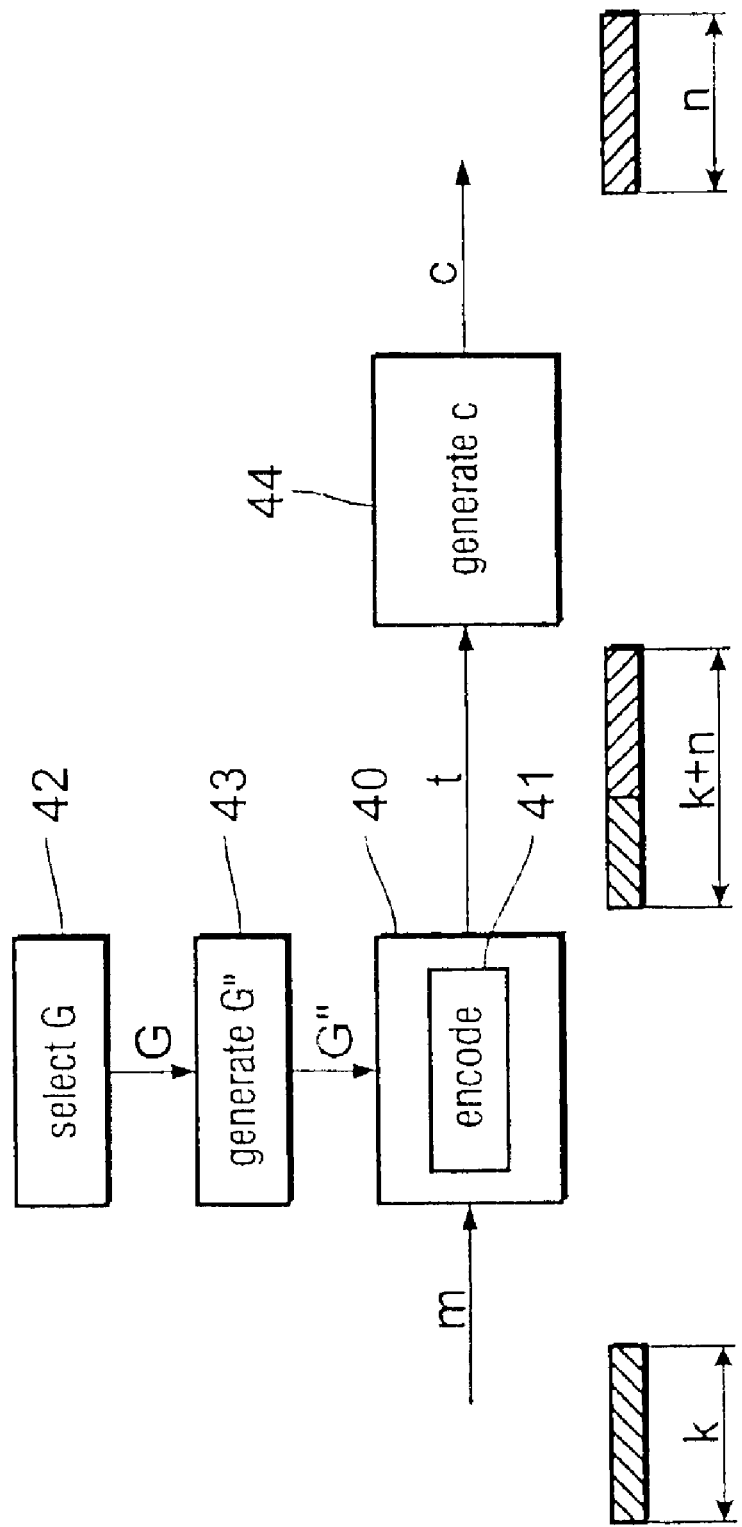
Figure 6:
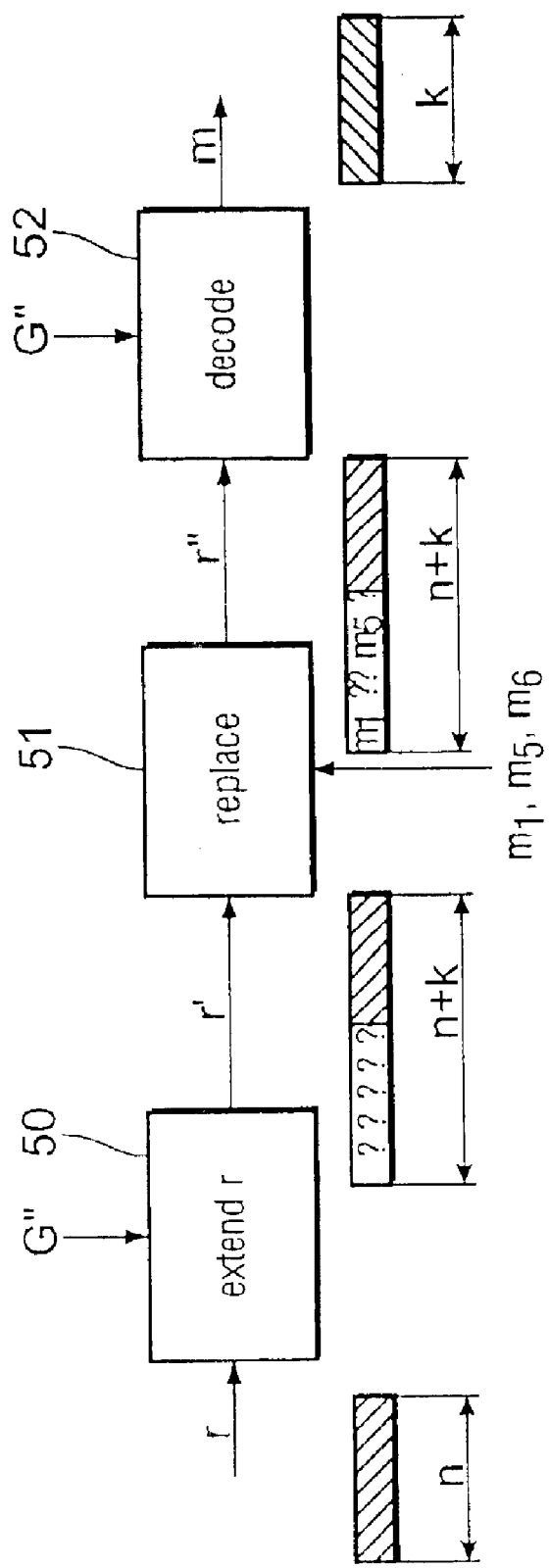
Figure 7:
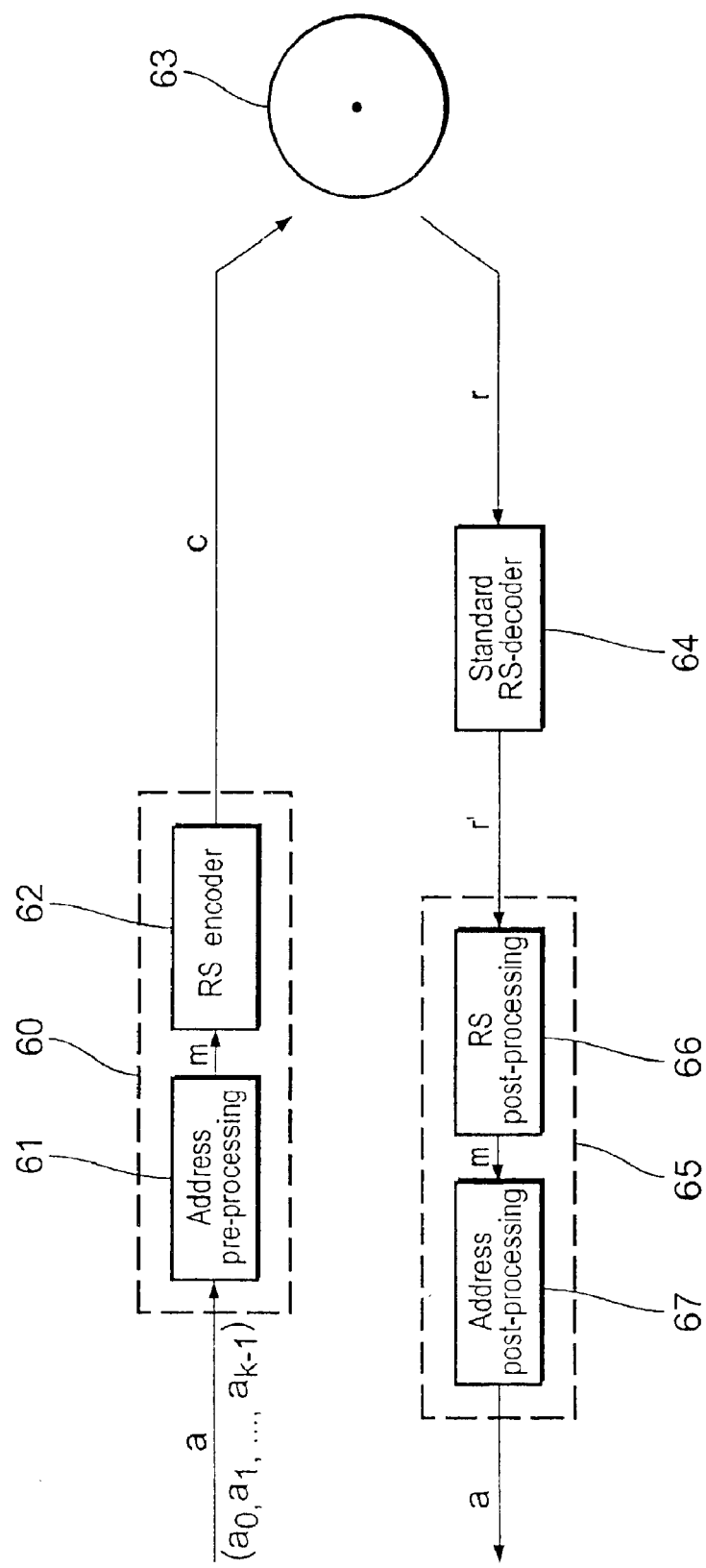
Figure 8:
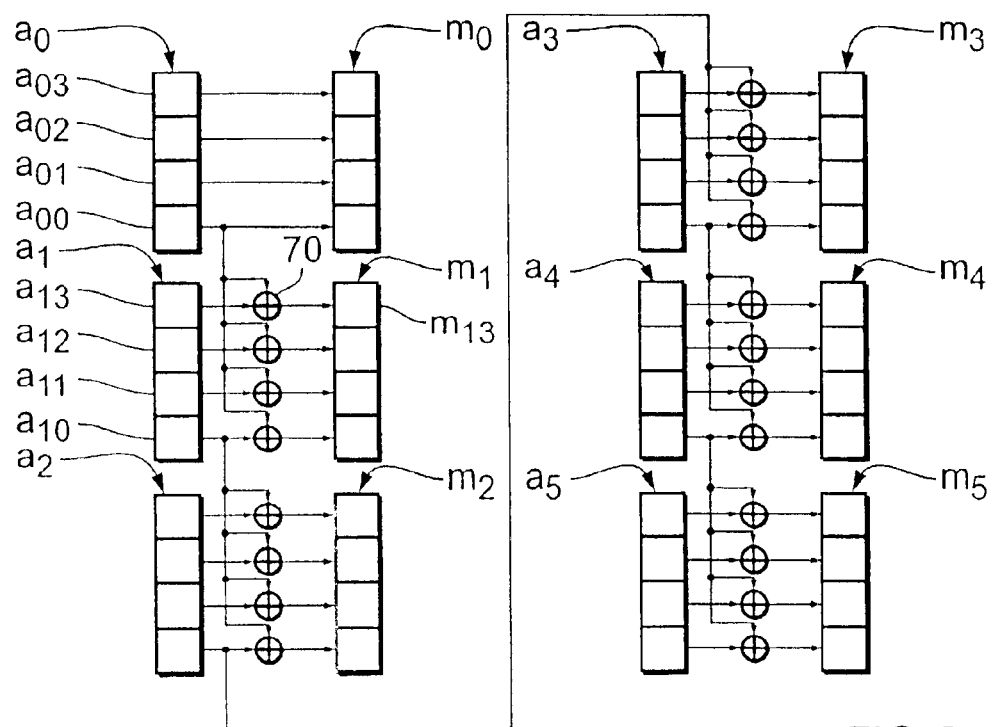
Figure 9:
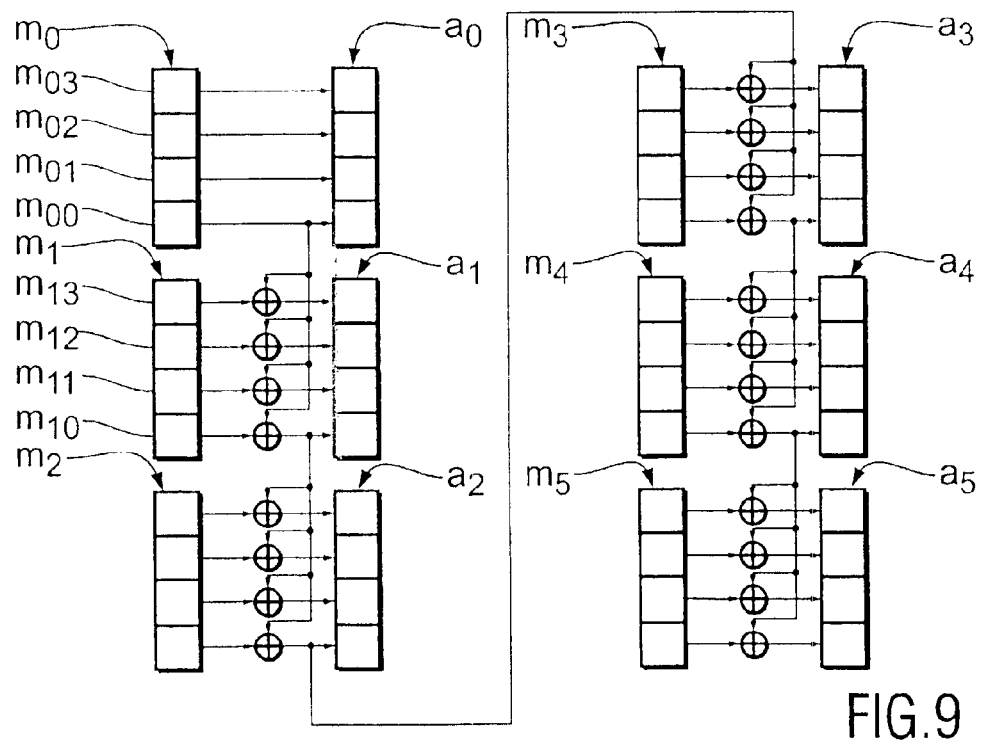

FIG. 3 shows an apparatus for encoding information words according to the invention, FIG. 4 shows an apparatus for decoding according to the invention, FIG. 5 shows another embodiment of an apparatus for encoding according to the invention, FIG. 6 shows a corresponding apparatus for decoding according to the invention, FIG. 7 shows a block diagram of another embodiment of the encoding and decoding scheme according to the invention, FIG. 8 shows a circuit for encoding address symbols into information symbols, and FIG. 9 shows a circuit for decoding information symbols into address symbols.

Figure 1:
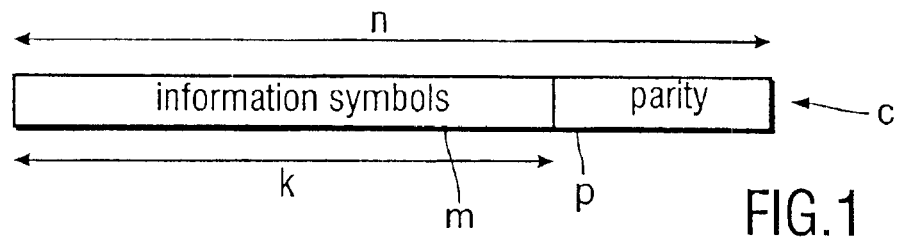
FIG. 1 shows the conventional format of a codeword.

FIG. 1 shows the typical scheme of codewords c of a [n, k] block code, e.g. a Reed-Solomon-Code. A codeword comprises an information word m comprising k information symbols and a parity word p comprising n–k parity symbols generated when encoding said information word m into a codeword c.

Figure 2:
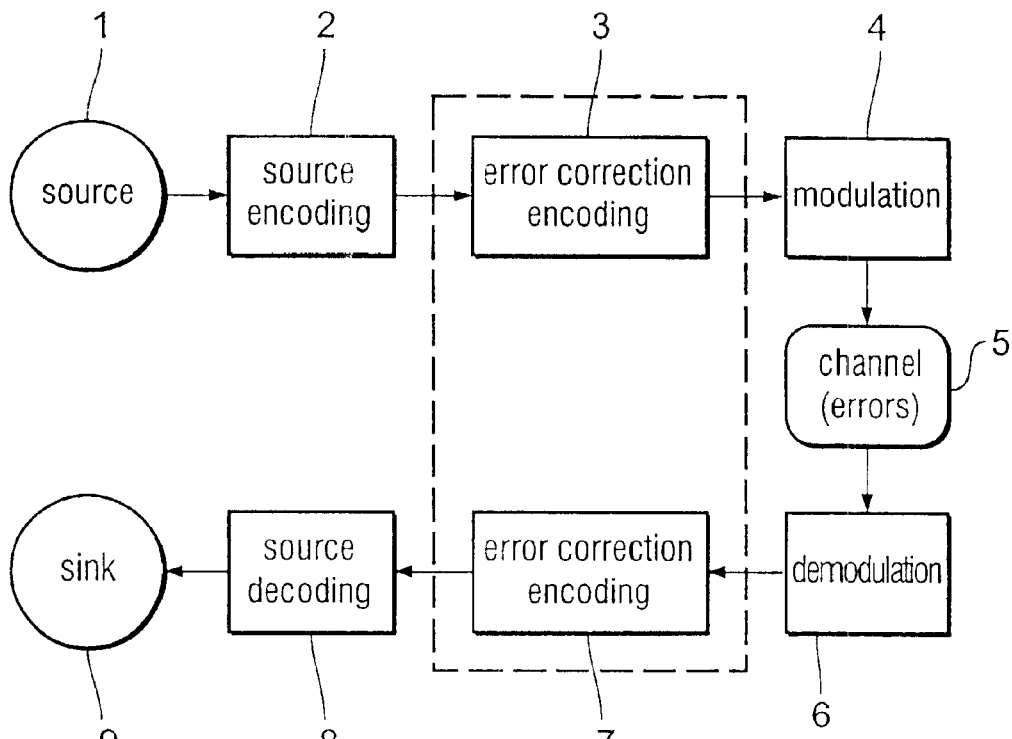
FIG. 2 shows a block diagram of the encoding and decoding scheme.

FIG. 2 shows a block diagram of a typical system using encoding and decoding. Therein user data, e.g. audio or video data, coming from a data source 1, e.g. recorded on a master tape or master disk, are encoded before they are stored on a data carrier, e.g. a disk, or transmitted over a transmission channel, e.g. over the internet, before they are again decoded for forwarding them to a data sink 9, e.g. for replaying them.

As can be seen the user data of the source 1 are first encoded by a source encoder 2, then error correction encoded by an ECC encoder 3 and thereafter modulated by a modulator 4, e.g. an EFM modulator, before the encoded user data—the codewords—are put on the channel 5 on which errors may be introduced into the codewords. The channel 5 shall here interpreted broadly, including a transmission channel as well as storage of the encoded data on a data carrier for a later replay.

When replay of data is intended, the encoded data first have to be demodulated by a demodulator 6, e.g. an EFM demodulator, before they are error correction decoded by an ECC decoder 7 and source decoded by a source decoder 8. Finally the decoded user data can be input to the sink 9, e.g. a player device for replay of the user data.

Such a general system is, however, not only used for encoding and decoding user data, but may as well be used for any kind of data like management data, in particular address data. Such address data arc used to find a certain location on a data carrier or in a data stream of user data. On recordable or rewriteable disks such address data are generally prerecorded on the empty disks before any user data are recorded.

The present invention refers to encoding and decoding of data. Therein a certain predetermined generator matrix is used the selection of which is also referred to by a method according to the invention. A particular application of the invention lies in the field of address retrieval of addresses used on optical record carriers.

FIG. 3 shows an embodiment of an apparatus for encoding information words m according to the present invention. Therein the encoding apparatus 10 comprises an encoding unit 11 for encoding the information words m comprising a fixed number of information symbols $m_1, m_2, \ldots m_k$ into codewords c of a code C. To achieve an improved error correction capacity a certain predefined generator matrix G is used for encoding the information words m. This generator matrix G is selected and defined once by a selection unit 12 and then provided or preferably stored in the encoding apparatus 10 and the decoding apparatus for continuous use.

By use of the generator matrix G the information words m are thus encoded into codewords c by the encoding unit 11. These codewords c can be provided to a writing unit 13 recording the codewords c on an optical record carrier 14, e.g. on a CD or a DVD.

By way of an example the invention, in particular a preferred selection of the generator matrix G, shall be explained in more detail. The example is based on the [7, 4, 3] binary Hamming code C generated by $g(x)=X^3+X+1$. At first the "normal" known use of the code shall be explained while thereafter the use of a code according to the invention shall be explained.

Usually, the code C is used in systematic form, which corresponds to a generator matrix $$G_{sys} = \begin{pmatrix} 1 & 0 & 0 & 0 & 1 & 0 & 1 \\ 0 & 1 & 0 & 0 & 1 & 1 & 1 \\ 0 & 0 & 1 & 0 & 1 & 1 & 0 \\ 0 & 0 & 0 & 1 & 0 & 1 & 1 \end{pmatrix}$$

having four (in general k) rows and seven (in general n) columns. An information word $m=(m_1, m_2, m_3, m_4)$ is mapped onto the codeword $c=m \cdot G_{sys}$. If the i-th information symbol $m_i$ is known to the decoder prior to decoding, the decoder can subtract the contribution of $m_i$ to the received word r prior to decoding. This means that the decoder decodes the residual received word $r-m_i \cdot G_{sys}^i$, where $G_{sys}^i$ indicates the i-th row of $G_{sys}$, to a code where the i-th row is removed from the generator matrix $G_{sys}$. The knowledge of up to any three information bits does not alter significantly the correction capacity for the unknown information bits, since almost all subcodes C' of the code C obtained by deleting at most three rows of $G_{sys}$ still have Hamming distance three. Only if the information bits $m_1$, $m_3$ and $m_4$ are known, the Hamming distance for retrieving $m_2$ is increased to four.

According to the present invention, another generator matrix $G_{id}$ for the same code C may be given as $$G_{id} = \begin{pmatrix} 1 & 1 & 1 & 1 & 1 & 1 & 1 \\ 0 & 1 & 0 & 0 & 1 & 1 & 1 \\ 1 & 1 & 0 & 1 & 0 & 0 & 1 \\ 1 & 1 & 1 & 0 & 1 & 0 & 0 \end{pmatrix} = \begin{pmatrix} g_1 \\ g_2 \\ g_3 \\ g_4 \end{pmatrix}.$$

If the (non-systematic) generator matrix $G_{id}$ is used for the encoding of the code C, an informed decoder as shown in FIG. 4 can decode to more favourable subcodes C' of the code C if certain information bits or information symbols—an information symbol may comprise more than one bit—are known. For example, if the decoder knows the first information bit $m_1$ it can use the subcode C' generated by the last three rows $g_2, g_3, g_4$ of $G_{id}$, which corresponds to a [7, 3, 4] simplex code. As another example, if the last three bits $m_2, m_3, m_4$ are known to the decoder, it can exploit the subcode generated by the first row of $G_{id}$ which corresponds to the [7, 1, 7] repetition code, thus enabling the decoder to recover $m_1$ reliably even in the presence of three bit errors.

An apparatus for decoding a read possibly mutilated codeword r is shown in FIG. 4. Therein the decoding apparatus 20 receives the possibly mutilated codeword r which has been read from the data carrier 14 by a reading unit 21. Assuming that an information word m encoded in a codeword c comprises four information symbols $m_1$, $m_2$, $m_3$, $m_4$ and assuming further that the apparatus 20 for decoding a priori knows three information symbols $m_2$, $m_3$, $m_4$, in a first step said known information symbols $m_2$, $m_3$, $m_4$ are encoded by an encoding unit 22 using the generator matrix G which is stored in the encoding apparatus 20 in a storage unit 23 and which had already been used for encoding the codewords c which are stored on the data carrier 14 and read as possibly mutilated codewords r. For such encoding the encoding unit 22 uses the rows of the generator matrix G which correspond to the known information symbols $m_2$, $m_3$, $m_4$.

In a subsequent step the result of such encoding, i.e. the products of the known information symbols $m_2$, $m_3$, $m_4$ with their corresponding rows $g_2, g_3, g_4$ of the generator matrix $G_{id}$, are added by a summing unit 24 giving an intermediate word s. In a subtracting unit 25 the intermediate word s is subtracted from the read codeword r, and the result of such subtraction is provided to a decoding unit 26. Therein the subcode C' which is generated by using a subcode generator matrix G' is decoded wherein the subcode generator matrix G' derives from the generator matrix G in the forming means 27 by omitting all rows from the generator matrix G which correspond to the known information symbols $m_2$, $m_3$, $m_4$, i.e. in the present example by omitting the rows $g_2, g_3, g_4$. So in the present example, the subcode generator matrix G' does only comprise the first row $g_1$ of the generator matrix G. As a result the unknown information symbol $m_1$ can be retrieved such that the complete information word m is finally known. In general, thus the contribution of said a priori known information symbols included in the possibly mutilated codeword is subtracted from said possibly mutilated codeword, and the result of said subtraction is decoded.

The method of decoding shall now be explained in more detail by way of an example. The codewords c of a code C shall be given by $$c = m \cdot G = (m_1 m_2 m_3 m_4)(g_1 g_2 g_3 g_4)^T = m_1 g_1 + m_2 g_2 + m_3 g_3 + m_4 g_4.$$

In general the generator matrix G comprises k rows and n columns, the information word m comprises k columns and a codeword c comprises n columns.

Assuming now that the information symbols $m_2, m_3, m_4$ are known a priori to a decoder and that a read codeword r is given by the sum of the stored codeword c plus an additional noise n the intermediate word s is first computed as $$s = m_2 g_2 + m_3 g_3 + m_4 g_4.$$

Thereafter a difference between the read possibly mutilated codeword r and the intermediate word s is calculated as:

$$r - s = c + n - s = m_1 g_1 + n.$$

Therein the information symbol $m_1$ can only be 0 or 1 if the information symbol $m_1$ comprises one bit, the row $g_1$ of the generator matrix G is fixed and the noise n is unknown. Using now the above given generator matrix $G_{id}$ selected according to the invention $g_1$ is given as (1 1 1 1 1 1 1) such that $m_1 g_1$ can only be (0 0 0 0 0 0 0) or (1 1 1 1 1 1 1). If the before mentioned calculation of $m_1 g_1+n$ has for example resulted in (0 0 1 0 0 1 1) the probability will be higher that $m_1 g_1$ is given as (0 0 0 0 0 0 0) leading to the result that $m_1$ has bit value 0. As can be seen from this example the information symbol $m_1$ can be determined despite three bit errors in the read codeword which means that the remaining subcode C' has Hamming distance seven.

As already explained the invention may be used for protecting addresses which are used on optical record carriers. However, the invention may also be used for protecting addresses in any serial data stream which may also be transmitted over a transmission line. In general, the invention may be applied in any application where information words shall be encoded into a code and where an improved error correction capacity shall be achieved if at least one information symbol is known a priori to the decoder.

An embodiment the invention based on code puncturing shall now be explained with reference to FIGS. 5 and 6. FIG. 5 illustrates the method of encoding an information word m into a codeword c and FIG. 6 illustrates the method of decoding a possibly mutilated codeword r into an information word m.

As shown in FIG. 5 the information word m comprising k information symbols is encoded by an encoding unit 41 of an encoding apparatus 40 using an intermediate generator matrix G". Said intermediate generator matrix G" derives from a generator matrix G which has been selected by a selection unit 42. The intermediate generator matrix G" is larger than the generator matrix G in that it comprises at least one more column than the generator matrix G. In general, the generator matrix G has k rows and n columns while the intermediate generator matrix G" has k rows and n+k columns and comprises k columns with a single non-zero entry at mutually different positions. When using said intermediate generator matrix G" for encoding the information word m, intermediate codewords t having k+n symbols are obtained. From said intermediate codeword t the codeword c is obtained from a codeword generating unit 44 by omitting a number of symbols of said intermediate codeword t. Therein the number of symbols to omit corresponds to the difference between the number of columns of said intermediate generator matrix G" and said generator matrix G. Thus, the obtained codeword c comprises n symbols. However, it is to be noted that also G can be used directly for encoding in the encoding apparatus instead of G".

During decoding a possibly multilated codeword r comprising n symbols is received by a decoder as shown in FIG. 6. In a first step the received word r is extended into a first pseudo codeword r' by an extension unit 50. Therein said intermediate generator matrix G" which has already been used in the encoder is used to determine the length of said pseudo codeword r", i.e. the number of symbols of said pseudo codeword r" corresponds to the number of columns of said intermediate generator matrix G", i. e. to the n symbols of the received word r k erasures are added to obtain the pseudo codeword r'. If G has been used directly for encoding instead of G", the pseudo codeword r' equals the n symbols of the received word r to which k erasures are added.

Thereafter, in a replacement unit 51 a priori known information symbols, e.g. $m_1$, $m_5$, $m_6$, are replaced in said pseudo codeword r' at positions of the erasures which correspond to the positions of said a priori known information symbols. This means that the erasures 1, 5 and 6 are replaced by the a priori known information symbols $m_1$, $m_5$, $m_6$. The obtained second pseudo codeword r" is thereafter inputted to a decoder unit 52 which is preferably a known error and erasure decoder decoding said second pseudo codeword r" by use of said intermediate generator matrix G" into the information word m comprising k symbols.

According to this embodiment of the invention a larger intermediate generator matrix G" is used compared to other embodiments of the invention. However, the advantage of this embodiment is that the information symbols do not need to be known a priori in successive order but any additional information symbol known a priori irrespective of the position of the information symbol within the information word generally leads to an enhanced minimum Hamming distance compared to the code used if no information symbols are known a priori.

The embodiment based on code puncturing shall now be illustrated differently. Considered is an [8, 3, 6] extended Reed-Solomon Code C over a Galois Field GF (8) defined as follows. The vector $c=(c_{-1}, c_0, c_1 \ldots, c_6)$ is in C if and only if $$c_{-1} = \sum_{i=0}^{6} c_i \text{ and } \sum_{i=0}^{6} c_i \alpha^{ij} = 0 \text{ for } 1 \leq j \leq 4.$$

Herein, $\alpha$ is an element of GF(8) satisfying $\alpha^3=1+\alpha$. It can be seen that the following intermediate generator matrix G" generates the code C $$G'' = \begin{pmatrix} 1 & 0 & 0 & \alpha^2 & 1 & \alpha^6 & \alpha^2 & \alpha^6 \\ 0 & 1 & 0 & \alpha^3 & 1 & \alpha^3 & \alpha & \alpha \\ 0 & 0 & 1 & \alpha^4 & 1 & \alpha^5 & \alpha^5 & \alpha^4 \end{pmatrix}.$$

The rightmost 5 columns of the intermediate generator matrix G" are used as a generator matrix G, i.e. the generator matrix G is $$G = \begin{pmatrix} \alpha^2 & 1 & \alpha^6 & \alpha^2 & \alpha^6 \\ \alpha^3 & 1 & \alpha^3 & \alpha & \alpha \\ \alpha^4 & 1 & \alpha^5 & \alpha^5 & \alpha^4 \end{pmatrix}.$$

The code generated by the generator matrix G has minimum Hamming distance 3. Knowledge of any j information symbols effectively increases the minimum Hamming distance from 3 to 3+j.

A block diagram of another embodiment of the encoding and decoding scheme according to the invention is shown in FIG. 7. Therein address words a comprising k address symbols $a_0, a_1, \ldots, a_{k-1}$ are fed into an encoder 60 comprising an address pre-processing unit 61 and an RS encoder 62. By the address pre-processing unit 61 the address words a are encoded into information words m comprising k information symbols $m_0, m_1, \ldots, m_{k-1}$ such that only one information symbol changes at a time when the address is incremented. This is achieved by applying a Gray Code, preferably by inverting an information symbol $a_i$ when the least significant bit of the previous symbol $a_{i-1}$ has bit value one.

An embodiment of an address pre-processing unit 61 is shown in FIG. 8. As can be seen therein the address symbols $a_0, a_1, \ldots, a_5$ are mapped onto information symbols $m_0, m_1, \ldots, m_5$. In the particular example each address symbol $a_i$ comprises four address bits $a_{i0}, a_{i1}, a_{i2}, a_{i3}$.

Similarly, each information symbol $m_i$ comprises four information bits. While the address bits $a_{o1}, \ldots, a_{o3}$ of the first address symbol $a_0$ are mapped directly on the information bits of the first information symbol $m_0$, the address bits of each successive address symbol $a_1, \ldots, a_5$ are separately input into an XOR gate 70 into which as a second input the least significant bit of the previous address symbol is fed. E. g. the most significant information bit $m_{13}$ of the second information symbol $m_1$ is the result of an XOR of the most significant bit $a_{13}$ of the second address symbol $a_1$, and the least significant bit $a_{00}$ of the first address symbol $a_0$.

In a particular application where an address word a comprises k=9 address symbols and an information word m comprises k=9 information symbols the most significant address symbol $a_0$ and the three auxiliary address symbols $a_6, a_7, a_8$ as (not shown) remain unchanged, i.e. $m_0=a_0$, $m_6=a_6$, $m_7=a_7$ and $m_8=a_8$, while the other address symbols are mapped onto information symbols as shown in FIG. 8.

The information words m are thereafter encoded into codewords c by the RS encoding unit 62 shown in FIG. 7. As encoding unit 62 an encoder which has been described above can be used. However, the encoding unit 62 can also be modified slightly.

The general definitions for implementing an encoder for encoding an information word m comprising k information symbols $m_0, m_1, \ldots, m_{k-1}$ into a codeword c of an [n, k, n−k+1] Reed-Solomon-Code over GF(q) are as follows:
The parent generator polynomial $g^{(P)}(x)$ is given as $$g^{(p)}(x) = \prod_{i=1-\lceil k/2 \rceil}^{n-1-\lceil k/2 \rceil} (x - \alpha^i),$$

wherein $\alpha$ is a non-zero element of GF(q) of order at most n and where $\lceil k/2 \rceil$ denotes k/2 rounded upwards, i.e. $\lceil k/2 \rceil$= k/2 if k is even and $\lceil k/2 \rceil$=(k+1)/2 if k is odd.

The component generator polynomials $g^{(i)}$ for $0 \leq i \leq k-2$ are defined by $$g^{(1)}(x) = \beta_1^{-1} \tilde{g}_{(1)}(x),$$

wherein $$\tilde{g}^{(i)}(x) = g^{(P)}(x)/(x-z_1)$$

and $$\beta_1 = \tilde{g}^{(1)}(z_1)$$

hold for $z_i = \alpha^{n-k+i/2}$ if i is even and $z_i = \alpha^{-(i+1)/2}$ if i is odd.

The codeword polynomial c(x) may be computed by $$c(x) = \sum_{i=0}^{n-1} c_i x^i = \sum_{i=0}^{k-2} m_i g^{(i)}(x) + m_{k-1} g^{(p)}(x),$$

wherein the coefficients of said codeword polynomial c(x) form the codeword c in the code C.

As a particular application the invention is used for encoding address words used in Digital Video Recording (DVR), particularly for encoding address words of wobble addresses used in DVR. The RS encoding unit 62 non uses a non-systematic [15, 9, 7] Reed-Solomon-Code with symbols having 4 bits. There are 9 information symbols $m_0, \ldots, m_8$ which are encoded into a codeword c(x) in the following way:

First, the parent generator polynomial $g^{(p)}(x)$ is defined as:

$$g^{(p)}(x) = \prod_{i=-d}^{9} (x - \alpha^i).$$

For each information symbol $m_i$ a generator polynomial $g^{(i)}(x)$ is defined which is derived from the parent generator polynomial $g^{(p)}(x)$ by removing one of the zeros of the parent generator polynomial and normalizing the result such that $g^{(i)}(z_i)=1$. The zero $z_i$ to be removed is given by:

$$z_i = \alpha^{i/2+6} \text{ for i even and } 0 \leq i \leq 6$$

$$z_i = \alpha^{-(i+1)/2} \text{ for i odd and } 1 \leq i \leq 7$$

The generator polynomials are then calculated for $0 \leq i \leq 7$ as follows:

$$g^{(1)}(x) = \beta_i^{-1} \tilde{g}^{(i)}(x),$$

wherein $$\tilde{g}^{(1)}(x) = g^{(P)}(x)/(x-z_i)$$

and $$\beta_{i=\tilde{g}}^{(1)}(z_i)$$

hold.

With the generator polynomials and the parent generator polynomial the codeword c(x) can be calculated by:

$$c(x) = \sum_{i=0}^{14} c_i x^i = \sum_{i=0}^{7} m_i g^{(i)}(x) + m_8 g^{(p)}(x),$$

wherein the coefficients of said codeword polynomial c(x) form the codeword c in the code C. $\alpha$ is the primitive root 0010 of the primitive polynomial $P(x)=x^4+x+1$. Codeword symbol $C_{14}$ is recorded on the disc 63 first; all bits of the codeword symbols $C_5, \ldots, c_0$ are inverted before recording.

In the particular application of the present invention the address is encoded with an RS code having length 15 and a minimum Hamming distance of d=7. In general, a non-zero codeword c with k consecutive zeros has a weight of at least k+1, i.e. has non-zero symbols in at least k+1 positions. Because the difference between two codewords is also a codeword, two codewords differ in at least k+1 positions, i.e. the minimum Hamming distance between two arbitrary codewords is k+1. In the code used according to the invention all codewords have zeros in $\alpha^0, \ldots, \alpha^5$, resulting in a minimum Hamming distance of d=7. If two information words m have an information symbol $m_i$ in common, the difference vector of the corresponding codewords will have an extra zero. If this zero extends the existing series of zeros, the minimum Hamming distance between all codewords which have $m_i$ in common will become 8. In other words, prior knowledge of an information symbol can increase the Hamming distance of the code.

Each information symbol $m_i$ corresponds to a zero in the parent generator polynomial $g^{(p)}(x)$. The following table gives the corresponding zero factor for each information symbol:

| Symbol | Corresponding zero factor |
|---|---|
| $m_7$ | $(x - \alpha^{-4})$ |
| $m_5$ | $(x - \alpha^{-3})$ |
| $m_3$ | $(x - \alpha^{-2})$ |
| $m_1$ | $(x - \alpha^{-1})$ |
|  | $(x - \alpha^0)$ |
|  | $(x - \alpha^1)$ |
|  | $(x - \alpha^2)$ |
|  | $(x - \alpha^3)$ |
|  | $(x - \alpha^4)$ |
|  | $(x - \alpha^5)$ |
| $m_0$ | $(x - \alpha^6)$ |
| $m_2$ | $(x - \alpha^7)$ |
| $m_4$ | $(x - \alpha^8)$ |
| $m_6$ | $(x - \alpha^9)$ |

It is to be noted that the information symbol $m_8$ does not have a corresponding zero. If an information symbol is known and its corresponding zero extends the existing series of zeros, the Hamming distance will increase. For instance, if $m_0$ or $m_1$ is known, the Hamming distance will become d=8. If ($m_0$ and $m_1$) or ($m_0$ and $m_2$) or ($m_1$ and $m_3$) are known, the Hamming distance will become d=9 etc.

The decoding method for the present ECC scheme is almost similar to the situation where a usual (systematic) RS code is used. If a possibly mutilated codeword r is read from the data carrier 63 (or is received via a transmission line) it is first decoded by a standard RS decoder 64, in the described application for a code having Hamming distance 7. In this particular way of decoding, the knowledge of some information symbols is only (implicitly) used as an additional check after decoding. It is also possible to use this knowledge by trying to correct more errors than can be done without this knowledge as explained above.

The obtained intermediate codewords r' are then input into a post-processing unit 65 comprising an RS post-processing unit 66 and an address post-processing unit 67. In the RS post-processing unit 66 the information symbols $m_i$ can be obtained by evaluating the intermediate codeword r' in the zero corresponding to the information symbol, i.e. by syndrome calculation:

$$m_i = \sum_{j=0}^{14} r'_j \cdot z_i^j \text{ for } 0 \leq i \leq 7.$$

The last information symbol, in the described example $m_8$, is a systematic symbol and can be obtained from the intermediate codeword directly by copying the last significant symbol of r', in the example $r'_{14}$.

In the address post-processing unit 67 the address words a can thereafter be obtained from the information symbols m using the circuit shown in FIG. 9 which is quite similar to the structure that is required for pre-processing the address words, i.e. the pre-processing unit 61 shown in FIG. 8.

The advantage of using the described ECC scheme is that the distance of the code can be increased when part of the address is known before decoding. It is however a drive option to actually use this prior knowledge. If this knowledge is not there this step can be skipped, which gives the usual decoding procedure with some post-processing to calculate the address from the intermediate codeword.

The extra distance of the RS code can be used when some of the symbols of the information word are known before decoding. When an access is made and the jump accuracy of the drive is known, the most significant address symbols at the target location are known. This information can be used for decoding. There are, however, areas where one of these symbols changes and might have two possible values. There are even situations where no address symbols are known if the reading/writing head should land near a spot where one or more of the most significant bits changes. One example is that the head should land at a location with address 01111111. The address of the next location then is 10000000 assuming that conventional binary representation is used, showing that no information symbol can be assumed known prior to decoding.

According to the invention an address pre-processing is used. Thus, only one of the information symbols $m_0 \ldots m_5$ will change at a time when going from the inside to the outside of the disc. Therefore, if the jump accuracy is such that the address of the actual landing place differs at most k from the address of the target landing place, at least k−1 symbols will be known for every jump.

To illustrate this with an example, a jump should supposedly be made to address 100000 (hex) with an accuracy such that the possible landing zone is between 0Fxxx(hex) and 10xxx(hex). Then the actual landing address will have ($a_0$, $a_1$) of either (0000, 1111) or (0001, 0000). Since ($a_0$, $a_1$)=(0001, 0000) is encoded into ($m_0$, $m_1$)=(0001, 1111) and ($a_0$, $a_1$)=(0000, 1111) is encoded into ($m_0$, $m_1$)=(0000, 1111), $m_1$ has a value of 1111 over the whole range. The knowledge of $m_1$ will increase the effective distance of the code. After decoding with the d=7 RS decoder and RS post-processing, $m_1$ can be used to check if the decoding result is valid. Checking if m=1111 is equal to checking if there is a valid combination of $a_0$ and $a_1$, i.e. (xxx0, 1111) or (xxx1, 0000). In other words, it should be checked if the decoded address is in the range that is defined by the jump accuracy of the drive.

The extra distance that can be won depends on the jump accuracy of the drive. The following table gives an overview of the three regimes which can be distinguished for a specific example of a disk format:

| Jump accuracy | Possible known symbols | Hamming distance | |
|---|---|---|---|
|  |  | Worst case | Typical |
| ±2000 tracks | $m_0$ $m_1$ | d = 8<br>Either $m_0$ or $m_1$ will be known. | d = 8 |
| ±100 tracks | $m_0$ $m_1$ $m_2$ | d = 8<br>When $m_0$ is not known, only the knowledge of $m_1$ will contribute to the Hamming distance. | d = 9 |
| ±8 tracks | $m_0$ $m_1$ $m_2$ $m_3$ | d = 9<br>There is only an area around one radius where $m_0$ is not known, so there $m_3$ is necessary to get to d = 9. In this case knowledge of $m_3$ requires a jump accuracy of ±8 tracks | d = 10 |

This tables shows that the jump accuracy can be interchanged with Hamming distance of the RS code. A large seek might have a smaller jump accuracy while a small seek or retry after a large seek might have a larger jump accuracy.

With some additional blocks in the decoding part, which are small and straightforward, the address can thus be read more reliable then with the known error correction scheme. The additional blocks are necessary to get the address information from the non-systematic codewords of the RS code. To use the advantages of the RS code only a check on the address after decoding is necessary. By checking if the decoded address is within the range that can be expected because of the jump accuracy, the reliability of the decoding result increases significantly. This is due to the extra distance created by the RS code used according to the invention.

The invention may also be explained as follows: If it is assumed that an error-correcting code C is used with a fixed generator matrix G and minimum Hamming distance d, the Gray code maps the address vector $a=(a_0, a_1, \ldots, a_{k-1})$ of address information and auxiliary data onto the vector g(a). The vector g(a) serves as information sequence for encoding with G, that is, a is mapped to g(a)G. If, now a is an address vector, and $\Delta$ is a positive integer, $I_a(\Delta)$ is defined as the set of indices in which there is agreement between g(a) and g(a') for any a' for which the address differs at most $\Delta$ from the address of a. The integer $\Delta$ can be regarded as the jump accuracy; a can be regarded as the target address on which the read or write head should land.

For example, 8-bits addresses shall be considered, where the i-th address corresponds to the binary representation of the integer i, and taking a=10010010. As a corresponds to the integer 146, the set $I_a(\Delta)$ is the subset of $\{0, 1, \ldots, 7\}$ of indices for which for any vector a' corresponding to a number between 146−$\Delta$ and 146+$\Delta$, g(a') agrees with g(a).

From the target address a and the jump accuracy $\Delta$, we could in principle compute $I_a(\Delta)$ and use in decoding that for every $i \in I_a(\Delta)$, the i-th information symbol of g(a'), where a' is the address of the actual landing location, equals the i-th symbol of g(a). The computation of $I_a(\Delta)$ for a given target address a can be quite cumbersome. Moreover, as $I_a(\Delta)$ depends on a, decoding in principle depends on a as well. In order to avoid that decoding depends on a, a conventional decoder for C can be used that decodes up to t errors, and it can be checked afterwards if the address of the decoding result a' differs at most $\Delta$ from the address of a. That is, the extra information on known information symbols of g(a) is not used in decoding, but is used for error detection purposes only.

If b denotes the (uncorrupted) address vector corresponding to the actual landing place, it is said that a miscorrection occurs if a' ≠ b. Such a miscorrection can have a very undesirable effect, e.g., writing can start at a wrong location (if a'=a), possibly even resulting in overwriting of data that should not be overwritten. If $d(I_a(\Delta))$ denotes the minimum distance of the code consisting of all words of C that have zeros in the information symbols indexed by $I_a(\Delta)$ then, as the address of b differs at most $\Delta$ from the address of a, the Hamming distance between a' and b is at least $d(I_a(\Delta))$, and so a miscorrection can only occur if at least $d(I_a(\Delta))$−t errors occur. If $d(I_a(\Delta))$ exceeds d, this is much less likely than the occurrence of d−t errors. In other words, the probability of miscorrection is seriously reduced.

In order that $d(I_a(\Delta))$ exceeds d, the code C must be judiciously encoded, i.e., the matrix G must be judiciously selected. One method is to use the construction based on code puncturing. It denotes X=(I G) a k x (n+k) matrix, where 1 denotes the k x k identity matrix, i.e., the k x k matrix with ones on the diagonal and zeroes elsewhere. It shall be assumed that the code generated by X has minimum distance d. Now two distinct information vectors, $m_1$ and $m_2$, that agree in j positions shall be considered. The words $m_1 X = (m_1 | m_1 G)$ and $m_2 X = (m_2 | M_2 G)$ differ in at least d positions. It can then be concluded that $m_1 G$ and $m_2 G$ differ in at least (d−(k−j)) positions.

Decoding of the code C generated by G can be done as follows. It shall be assumed a set J of information symbols is known. To the received vector of length n, (conceptually) k symbols are placed as prefix. The known symbols, corresponding to J, are filled in; the remaining symbols are declared as erasures. Next, an error-and-erasure decoder for the code generated by X is applied. In this way, the knowledge of some information symbols can be used for correcting more errors than possible without this knowledge. If it is chosen to employ the knowledge of some information symbols for error detection only, as explained above, a decoder for C is required. Such a decoder can be implemented as follows. To a received vector, k erasures are placed as prefix, irrespective of J, and an error-and-erasure decoder for the code generated by X is applied.

What is claimed is:

1. Method of encoding address words (a) comprising address symbols $(a_0, a_1, \ldots, a_{k-1})$ into codewords (c) of a code (C) for providing an enhanced error correction capability if at least one information symbol $(m_1)$ of information words (m) is known a priori to a decoder decoding received, possibly mutilated codewords (r), said method comprising the steps of:

encoding the address words (a) into information words (m) such that address words comprising addresses being close to each other share a plurality of information symbols, encoding said information words (m) into codewords (c) using a generator matrix (G) selected such that the minimum Hamming distance of at least one subcode (C') of said code (C) is larger than the minimum Hamming distance of said code (C) and that a subcode generator matrix (G') of said subcode (C') derives from said generator matrix (G) of said code (C) by omitting the at least one row from said generator matrix (G) corresponding to said at least one a priori known information symbol $(m_1)$.

2. Method according to claim 1,
wherein the information words (m) comprising k information symbols $(m_0, m_1, \ldots, m_{k-1})$ are encoded into codewords (c) of an [n, k, n−k+1] Reed-Solomon code over GF(q), said encoding comprising the steps of:

a) defining a parent generator polynomial $(g^{(P)}(x))$ $$g^{(p)}(x) = \prod_{i=1-\lceil k/2 \rceil}^{n-1-\lceil k/2 \rceil} (x - \alpha^i),$$

wherein $\alpha$ is a non-zero element of GF(q) of order at most n and where $\lceil k/2 \rceil$ denotes k/2 rounded upwards, i.e. $\lceil k/2 \rceil = k/2$ if k is even and $\lceil k/2 \rceil = (k+1)/2$ if k is odd;

b) defining component generator polynomials $(g^{(i)})$ for $0 \leq i \leq k-2$ are defined by $g^{(i)}(x) = \beta_1^{-1} \tilde{g}^{(1)}(x),$ wherein $\tilde{g}^{(1)}(x) = g^{(p)}(x)/(x-z_1)$ and $\beta_1 = \tilde{g}^{(1)}(z_1)$ hold for $z_i = \alpha^{n-k+i/2}$ if i is even and $z_i = \alpha^{-(i+1)/2}$ if 1 is odd;

c) computing the codeword polynomial (c(x)) according to $$c(x) = \sum_{i=0}^{n-1} c_i x^i = \sum_{i=0}^{k-2} m_i g^{(i)}(x) + m_{k-1} g^{(p)}(x),$$

wherein the coefficients of said codeword polynomial (c(x)) form the codeword (c) in the code (C).

3. Apparatus for encoding address words (a) comprising address symbols ($a_0, a_1, \ldots, a_{k-1}$) into codewords (c) of a code (C) for providing an enhanced error correction capability if at least one information symbol ($m_1$) of information words m is known a priori to a decoder decoding received, possibly mutilated codewords (r), comprising means for encoding said address words (a) into said codewords (c) using a method according to claim 1.

4. Apparatus for decoding possibly mutilated codewords (r) of a code (C) into address words (a) comprising address symbols ($a_0, a_1, \ldots, a_{k-1}$), said address words (a) being encoded into codewords (c) of said code (C) using a generator matrix (G) and said code (C) being provided with an enhanced error correction capability if at least one information symbol ($m_1$) is known a priori before decoding, wherein said address words (a) are encoded into said codewords (c) using a method according to claim 1 and that the contribution of said at least one a priori known information symbol ($m_1$) included in said possibly mutilated codeword (r) is taken into account for decoding said possibly mutilated codeword (r) with enhanced error correcting capabilities.

5. Computer program product comprising program code means for causing a computer to perform the method of claim 1.

6. Signal for transmitting user data, said signal including system data items encoded by a method according to claim 1.

7. Method according to claim 1, wherein said method is used for encoding address words used in Digital Video Recording (DVR), in particular for encoding address words of wobble addresses.

8. Method according to claim 7, wherein the information words (m) comprising 9 information symbols ($m_0, m_1, \ldots, m_8$) are encoded to codewords (c) of an [15, 9, 7] Reed-Solomon code over GF(q), said encoding comprising the steps of:

a) defining a parent generator polynomial ($g^{(p)}(x)$)

$$g^{(p)}(x) = \prod_{i=-4}^{9} (x - \alpha^i),$$

wherein $\alpha$ is a non-zero element of GF(q) of order at most n;

b) defining component generator polynomials ($g^{(i)}$) for $0 \leq i \leq 7$ $$g^{(i)}(x) = \beta_i^{-1} \tilde{g}^{(i)}(x)$$

wherein $$\tilde{g}^{(i)}(x) = g^{(p)}(x)/(x - z_i)$$

and $$\beta_i = \tilde{g}^{(i)}(z_i)$$

hold for $z_i = \alpha^{i/2+6}$ for i even and $0 \leq i \leq 6$ $z_i = \alpha^{-(i+1)/2}$ for i odd and $1 \leq i \leq 7$;

c) computing the codeword polynomial (c(x)) according to $$c(x) = \sum_{i=0}^{14} c_i x^i = \sum_{i=0}^{7} m_i g^{(i)}(x) + m_8 g^{(p)}(x),$$

wherein the coefficients of said codeword polynomial (c(x)) form the codeword (c) in the code (C).

9. Data carrier for recording user data, in particular optical data carrier used according to the standard for DVR, said data carrier having stored system data items encoded by a method according to claim 1.

10. Data carrier according to claim 9, wherein said system data items comprise address data and/or timing data used for finding a position on said data carrier.

11. Method according to claim 1, wherein the address words (a) are encoded into information words (m) such that from a fixed set of at least two information symbols at most one information symbol changes if the address is incremented.

12. Method according to claim 11, wherein a number of address words (a) are encoded into information words (m) by inverting address symbols ($a_i$) of an address word (a) if the least significant bit of the respective previous address symbol ($a_{i-1}$) has bit value one.

13. Method according to claim 12, wherein the address symbols of an address word (a) are inverted by calculating the exclusive OR result between all bits of an address symbol ($a_i$) and the least significant bit of the respective previous address symbol ($a_{i-1}$).

14. Method of decoding possibly mutilated codewords (r) of a code (C) into address words (a) comprising address symbols ($a_0, a_1, \ldots, a_{k-1}$), said address words (a) being encoded into codewords (c) of said code (C) using a generator matrix (G) and said code (C) being provided with an enhanced error correction capability if at least one information symbol ($m_1$) is known a priori before decoding, characterized in that said address words (a) are encoded into said codewords (c) using a method according to claim 1 and that the contribution of said at least one a priori known information symbol ($m_1$) included in said possibly mutilated codeword (r) is taken into account for decoding said possibly mutilated codeword (r) with enhanced error correcting capabilities.

15. Method according to claim 14, comprising the steps of:

a) decoding the possibly mutilated codewords (r) into intermediate codewords (r'), b) decoding said intermediate codewords (r') into information words (m), c) decoding said information words (m) into address words (a).

16. Method according to claim 15, wherein said information words (m) are decoded into address words (a) by inverting information symbols ($m_i$) of an information word (m) if the least significant bit of the respective previous information symbol ($m_{i-1}$) has bit value one.

* * * * *